United States Patent
Beer et al.

(10) Patent No.: US 7,268,423 B2
(45) Date of Patent: Sep. 11, 2007

(54) FLEXIBLE REWIRING PLATE FOR SEMICONDUCTOR COMPONENTS, AND PROCESS FOR PRODUCING IT

(75) Inventors: Gottfried Beer, Nittendorf (DE); Jochen Dangelmaier, Beratzhausen (DE); Alfred Haimerl, Sinzing (DE); Manfred Mengel, Bad Abbach (DE); Klaus Mueller, Regensburg (DE); Klaus Pressel, Regensburg (DE)

(73) Assignee: Infineon Technologies AG, Munich (DE)

(*) Notice: Subject to any disclaimer, the term of this patent is extended or adjusted under 35 U.S.C. 154(b) by 288 days.

(21) Appl. No.: 11/013,851

(22) Filed: Dec. 16, 2004

(65) Prior Publication Data
US 2005/0142933 A1  Jun. 30, 2005

(30) Foreign Application Priority Data
Dec. 17, 2003 (DE) .................... 103 59 424

(51) Int. Cl.
*H01L 23/48* (2006.01)
(52) U.S. Cl. .............. 257/698; 257/688; 257/759; 257/E23.177; 257/E23.165; 257/E23.03; 257/E23.074; 977/932; 977/742
(58) Field of Classification Search ........... 257/698
See application file for complete search history.

(56) References Cited

U.S. PATENT DOCUMENTS

| 5,529,950 | A | 6/1996 | Hoenlein et al. |
| 5,805,424 | A | 9/1998 | Purinton |
| 2003/0046809 | A1 | 3/2003 | Mergenthaler |
| 2003/0179559 | A1 | 9/2003 | Engelhardt et al. |
| 2003/0211724 | A1* | 11/2003 | Haase .................. 438/629 |
| 2004/0246650 | A1* | 12/2004 | Grigorov et al. ........ 361/212 |
| 2006/0091557 | A1* | 5/2006 | Sakamoto et al. ........ 257/774 |

FOREIGN PATENT DOCUMENTS

| EP | 0726621 | 8/1996 |
| WO | 01/57917 | 8/2001 |

* cited by examiner

*Primary Examiner*—Jerome Jackson
(74) *Attorney, Agent, or Firm*—Dicke, Billig & Czaja, PLLC

(57) ABSTRACT

The present invention describes a rewiring plate for components with connection grids of between approx. 100 nm and 10 μm, which rewiring plate includes a base body and passages with carbon nanotubes, the lower end of the passages opening out into contact connection surfaces, and the carbon nanotubes forming an electrically conductive connection from the contact connection surfaces to the front surface of the base body.

17 Claims, 3 Drawing Sheets

FLEXIBLE REWIRING PLATE FOR SEMICONDUCTOR COMPONENTS, AND PROCESS FOR PRODUCING IT

CROSS-REFERENCE TO RELATED APPLICATIONS

This Utility Patent Application claims priority to German Patent Application No. DE 103 59 424.8, filed on Dec. 17, 2003, which is incorporated herein by reference.

FIELD OF THE INVENTION

The invention relates to a rewiring plate for semiconductor components with a dense connection grid, which rewiring plate serves to absorb mechanical loads in the contact-connection plane and/or as a rewiring level, and to a process for simplifying the production thereof.

BACKGROUND

In the context of the present invention, the term a "semiconductor component with a dense connection grid" is to be understood as meaning a semiconductor component whose semiconductor chip contact connection surfaces and distances between these contact connection surfaces are of a size of from approx. 100 nanometers to approx. 10 micrometers.

For integrated circuits (ICs), component forms with a dense connection grid are becoming increasingly important. One typical problem with these components is that during operation problems arise with the reliability of the corresponding contact connections on account of the different thermal expansion of semiconductor chip and substrate.

In the present text, the term "substrate" is used in particular for printed-circuit boards as are used in flip-chip mounting. However, it is also conceivable and possible for the substrate used to be a metallic flat conductor or a ceramic carrier. However, the precise type and/or material of the substrate is of no importance to the present invention.

To overcome the problem outlined above, nowadays it is typical for a rewiring plate to be inserted between semiconductor chip and substrate, the material, geometry and arrangement of the contact-connections of which rewiring plate are selected in such a way that the mechanical load of the original contact connections is reduced, so that the reliability of the component is increased.

The prior art has disclosed a wide range of rewiring plates which differ either in terms of their basic material, the arrangement of their contacts and/or their geometry. However, one drawback associated with all these rewiring plates is that they are intended for connection grids with contact sizes in the range from a few hundred micrometers down to at least approx. 50 µm, in accordance with current semiconductor chip design. Although further miniaturization is intended, the materials and geometries and/or production techniques used mean that this is not possible or is only possible with a very high level of outlay.

A press release dated Sep. 16, 2003 from the AIST (National Institute of Advanced Industrial Science and Technology, Japan) has disclosed a rewiring plate with a very dense connection grid (high density fine wiring interposer), which comprises extremely fine wires with a diameter of approx. 7.5 µm and a special, nonconductive matrix and which is intended for connection grids of the order of magnitude of approx. 20 µm.

However, since it can be predicted that the connection densities will increase still further and/or that the size of the connection surfaces and the distances between them will be reduced still further, there is a need for rewiring plates for future components with connection grids of the order of magnitude of between approx. 100 nm and approx. 10 µm.

SUMMARY

One embodiment of the invention provides a rewiring plate for semiconductor components with a dense connection grid, which rewiring plate serves to absorb mechanical loads in the contact-connection plane and/or as a rewiring level, and to a process for simplifying the production thereof.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
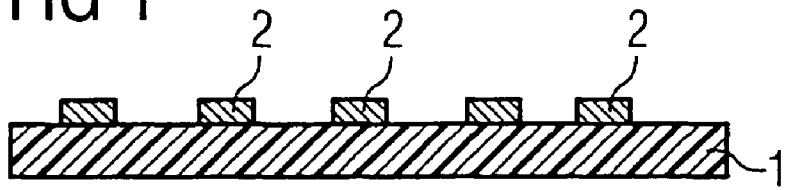
FIG. 1 illustrates a carrier plate with electrical contact connection surfaces with a nanometer connection grid.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel rewiring plate which is suitable for these very dense connection grids.

In one embodiment, a rewiring plate in accordance with the present invention includes a flexible or rigid base body has passages which run perpendicular to the surface of the base body. The diameter of the passages and the distance between two passages is predetermined by the connection grid of the semiconductor component for which the rewiring plate is to be used.

A purpose of the base body is to reduce the mechanical loads which act on the contact connections between semiconductor chip and substrate and which are caused by the different expansions of semiconductor chip and substrate when the component is operating. In addition, the base body forms a carrier for the contact-connections embedded in it, which makes it possible for the very fine contact-connections used in accordance with the present invention to be handled without damage.

For the base body it is possible to use all materials which are electrically insulated. Furthermore, it is advantageous if the plastic selected can easily be processed in accordance with the geometries required by the present invention. Furthermore, the plastic selected should be chemically inert with respect to the materials with which it is contact in the semiconductor component. Furthermore, the plastic for the base body is selected in such a way that its elasticity is sufficient to be able to absorb the expected mechanical loads. Therefore, the choice of plastic is also dependent, for example, on the size of the semiconductor chips and the maximum operating temperature of the semiconductor component.

A suitable material according to the present invention for the base body is silicone. Silicone is an electrically insulating and elastic plastic, the properties of which, such as for example its elasticity, do not vary even at elevated temperatures, e.g., when the component is operating.

Either one or a plurality of carbon nanotubes is/are located in the passages formed in the base body. The number of carbon nanotubes per passage depends on the intended use and therefore in turn on the connection grid of the corresponding semiconductor component.

Typical connection grids for which rewiring plates according to the present invention are advantageously used are of the order of magnitude of from approx. 100 nm to approx. 10 µm.

The lower end of the passages opens out into electrical contact connection surfaces which are in electrically conductive contact with the carbon nanotubes.

The carbon nanotubes used to form the contact connection are not only very good electrical conductors but are also excellent thermal conductors. Consequently, a rewiring plate according to the present invention not only allows very fast signal conduction but also allows optimized dissipation of heat from the semiconductor chip to the substrate for a given dense connection grid.

A rewiring plate according to the present invention can be used for various connection grids. The size of the passages and the number of carbon nanotubes per passage depend on the connection grid of the corresponding semiconductor component for which the rewiring plate is intended. In this context, on account of the maximum possible electrical and thermal conductivity, it is advantageous if the passages are accurately matched to the connection grid and a plurality of carbon nanotubes or carbon nanotube bundles are located in each passage.

If the connection grid is very dense, i.e. with an order of magnitude of less than approx. 1 micrometer, however, it is also possible, according to the present invention, to produce a rewiring plate with extremely small passages which in each case include only one carbon nanotube.

Depending on the particular application, the base body with the passages and the carbon nanotubes may be applied to a carrier plate, which increases the mechanical stability of the rewiring plate and thereby facilitates handling in an automated production environment. This is particularly advantageous if the rewiring plate is a rewiring plate with extremely fine passages and only one or a small number of carbon nanotubes.

Rewiring plates according to the present invention can either be mounted permanently between semiconductor chip and substrate or, for special components, may be designed as a contact element which can be removed again and reused. If the rewiring plate is only to be used to produce a temporary connection, it is advantageous if an electrically conductive layer, in the form of contact connection surfaces which are matched to the passage size, is applied to the top sides of the passages in order to protect the carbon nanotubes and to simplify the contact connection.

FIG. 1 illustrates a carrier plate 1, to which electrical contact connection surfaces 2 with a nanometer connection grid have been applied. The distance between two contact connection surfaces 2 approximately corresponds to the size of the contact connection surfaces 2 themselves.

Figure 2:
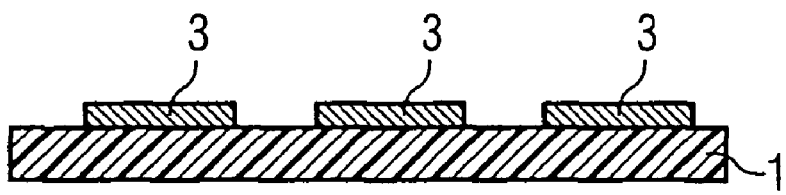
FIG. 2 illustrates a carrier plate with electrical contact connection surfaces with a micrometer connection grid.

FIG. 2 illustrates a carrier plate 1 similar to that shown in FIG. 1, except that the diameter of contact connection surfaces 3 is in the micrometer range. The distance between the contact connection surfaces 3 is slightly smaller than the diameter of the contact connection surfaces 3.

Figure 3:
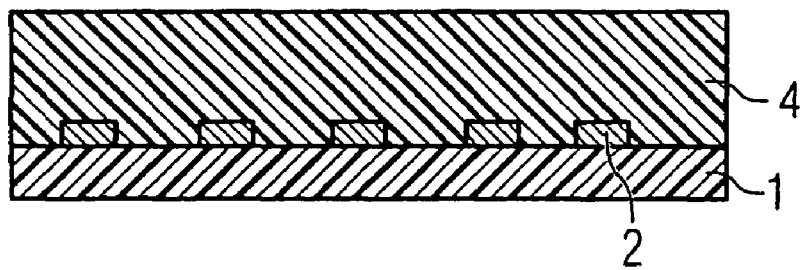
FIG. 3 illustrates the carrier plate from FIG. 1 after the application of a base body.

FIG. 3 illustrates the carrier plate 1 from FIG. 1 after the application of a base body 4. The base body 4 is located on that side of the carrier plate 1 which also has the contact connection surfaces 2. The base body 4 covers the contact connection surfaces 2 completely and has a planar surface 6 running parallel to the carrier plate 1.

Figure 4:
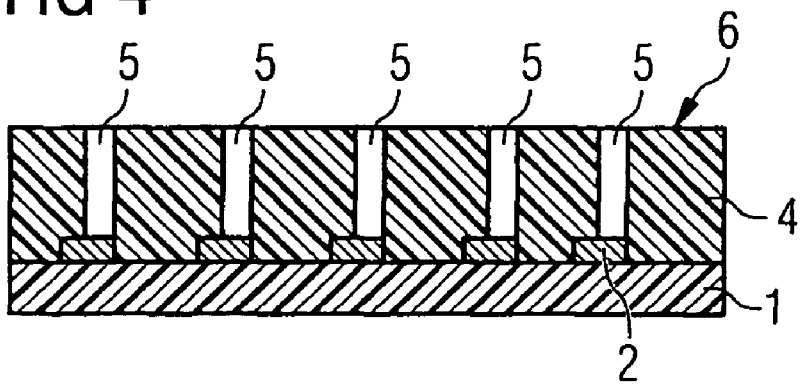
FIG. 4 illustrates the carrier plate from FIG. 1 after the application of a base body and the etching of passages.

FIG. 4 illustrates the carrier plate 1 from FIG. 1 with passages 5 which lead from the top side 6 of the base body 4 through the base body 4 to the contact connection surfaces 2. The passages 5 are in this case positioned perpendicularly on the contact connection surfaces 2 or on the carrier plate 1. The diameter of the passages 5 approximately corresponds to the size of the contact connection surfaces 2.

Figure 5:
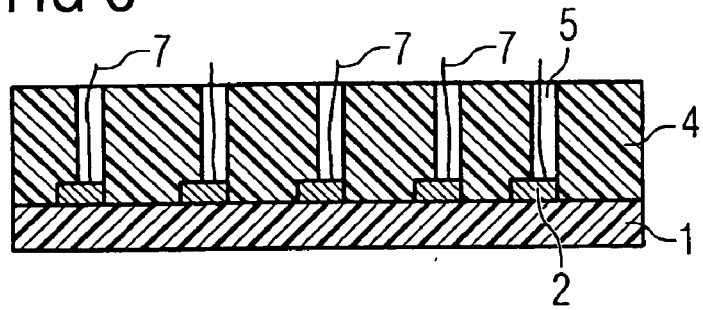
FIG. 5 illustrates the rewiring plate according to the invention of FIG. 1 with in each case one carbon nanotube per passage.

FIG. 5 illustrates a rewiring plate according to the invention including the passages 5, which each include one carbon nanotube 7 per passage 5. At one end, the carbon nanotubes 7 are in electrically conductive contact with the front surface of the contact connection surfaces 2, and at the other end they project slightly out of the passage 5 and therefore above the surface 6 of the base body 4.

Figure 6:
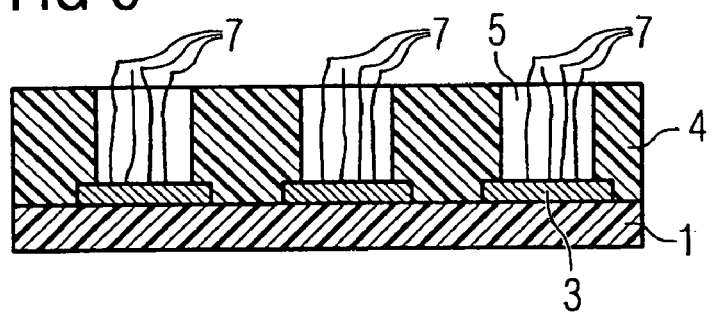
FIG. 6 illustrates the rewiring plate according to the invention of FIG. 2 with a plurality of carbon nanotubes per passage.

FIG. 6 illustrates a further rewiring plate according to the invention, with contact connection surfaces 3 with a micrometer connection grid. The diameter of the passages 5 once again corresponds to that of the contact connection surfaces 3. In this case, however, unlike in the case of the rewiring plate illustrated in FIG. 5, there are a plurality of carbon nanotubes 7 or a carbon nanotube bundle in each passage 5. At one end, the carbon nanotubes 7 are in electrically conductive contact with the front surface of the contact connection surfaces 2, and at the other end they project slightly out of the passage 5 and therefore above the surface 6 of the base body 4.

Figure 7:
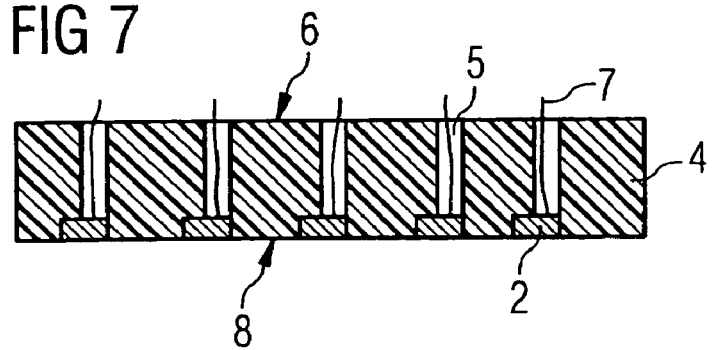
FIG. 7 illustrates the rewiring plate according to the invention of FIG. 1 after removal of the carrier plate.

FIG. 7 illustrates a further embodiment of the present invention, which differs from that illustrated in FIG. 5 by virtue of the fact that the carrier plate 1 has been removed. The passages 5 with individual carbon nanotubes 7 and the contact connection surfaces 2 are embedded in this base body. The back surfaces of the contact connection surfaces 2 end flush with the back surface 8 of the base body 4. At one end, the carbon nanotubes 7 are in electrically conductive contact with the front surface of the contact connection surfaces 2, and at the other end they project slightly out of the passage 5 and therefore above the surface 6 of the base body 4.

Figure 8:
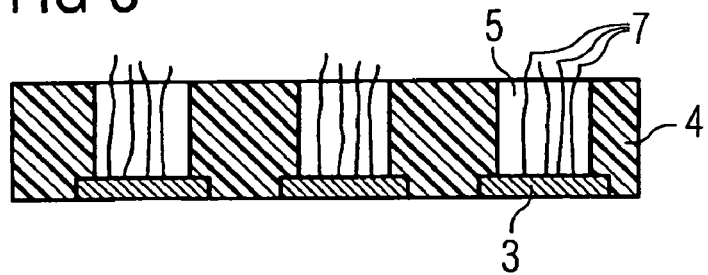
FIG. 8 illustrates the rewiring plate according to the invention of FIG. 2 after removal of the carrier plate.

FIG. 8 illustrates a further embodiment of the rewiring plate according to the invention. This rewiring plate corresponds to that illustrated in FIG. 7, but has contact connection surfaces 3 with a micrometer connection grid. The passages 5, unlike the rewiring plate illustrated in FIG. 7, include a plurality of carbon nanotubes or a carbon nanotube bundle, rather than just a single carbon nanotube.

Figure 9:
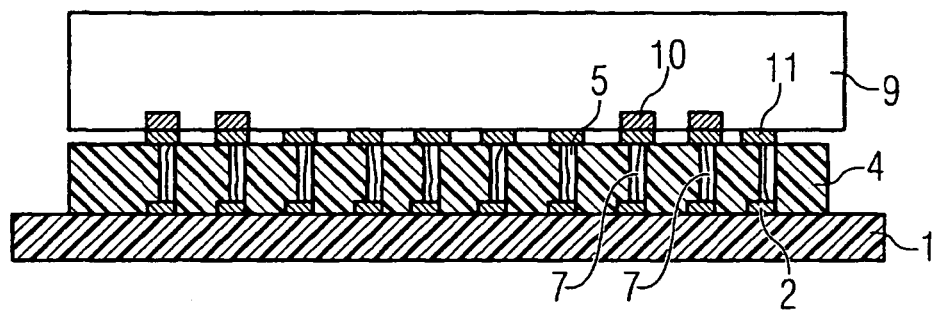
FIG. 9 illustrates an example of a use for a rewiring plate of FIG. 5.

FIG. 9 illustrates one example of a use for the rewiring plate according to the invention illustrated in FIG. 5. A semiconductor chip 9 with chip-side contact connection surfaces 10 has been applied to the rewiring plate. The chip-side contact connection surfaces 10 are in electrically conductive contact, via intermediate contacts 11, with the carbon nanotubes 7.

Figure 10:
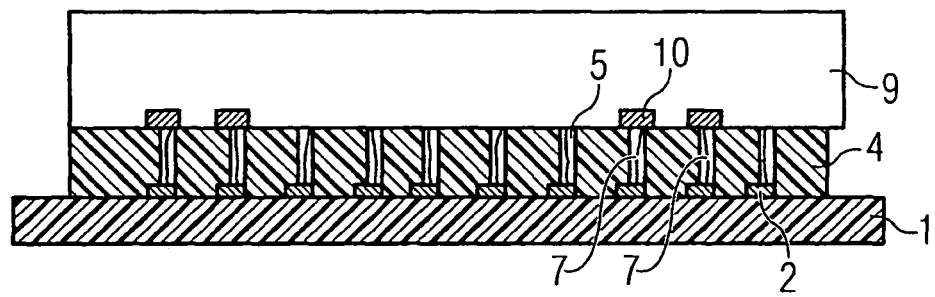
FIG. 10 illustrates an example of a use for a rewiring plate of FIG. 6.

FIG. 10 illustrates another example of a use for the rewiring plate according to the invention illustrated in FIG. 5. In this case, the chip-side contact connection surfaces 10 are in direct contact with the carbon nanotubes 7 of the rewiring plate. Unlike in the exemplary embodiment illustrated in FIG. 9, the semiconductor chip 9 rests directly on the base body 4.

Figure 11:
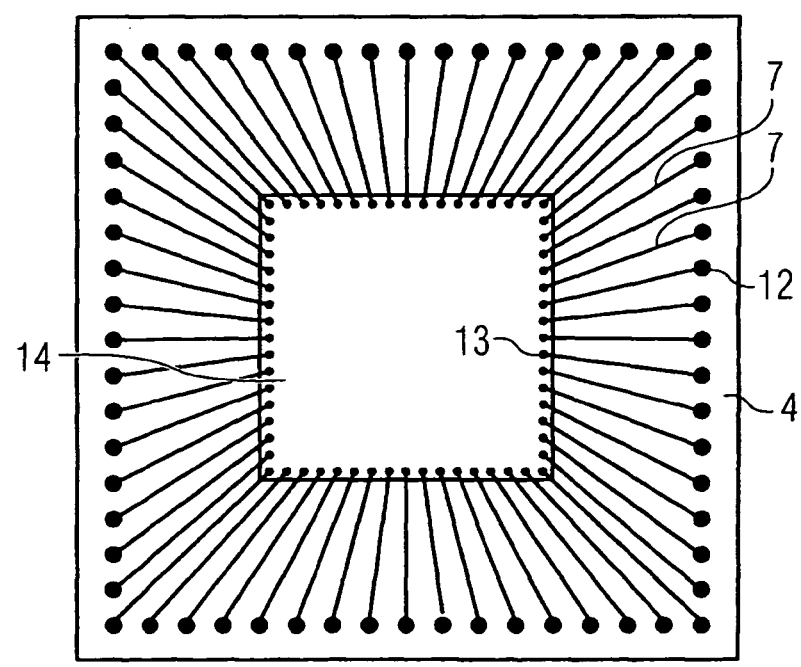
FIG. 11 illustrates a further example of a use of the present invention.

FIG. 11 illustrates a further example of a use for the rewiring plate according to the invention. In this case, the carbon nanotubes 7 do not run perpendicular to the surface of the carrier plate 1, as in the exemplary embodiments shown heretofore, but rather run parallel to this surface. The carbon nanotubes 7 start at inner contact connection surfaces 13, the physical arrangement of which corresponds to the arrangement of the chip-side contact connection surfaces (not shown here). The carbon nanotubes 7 lead from the inner contact connection surfaces 13 to outer contact connection surfaces 12 at the edge of the rewiring plate. In this case, the connection grid or the distance between the inner contact connection surfaces 13 is smaller than the distance between the outer contact connection surfaces 12.

FIGS. 1-8 serve to illustrate the production and schematic structure of a rewiring plate in accordance with one embodiment of the present invention.

FIG. 1 and FIG. 2 illustrate the carrier plate 1 to which contact connection surfaces 2 with a nanometer connection grid or contact connection surfaces 3 with a micrometer connection grid are applied by conventional metal deposition means.

As illustrated in FIG. 3, a base body 4, which completely encloses the contact connection surfaces 2 or 3 and has a certain height, so that passages 5 can be etched or burnt into this base body 4, as illustrated in FIG. 4, is then applied to the carrier plate 1 which has been prepared in this way; the passages 5 are intended to accommodate the carbon nanotubes 7 or the carbon nanotube bundle.

According to one embodiment of the present invention, the base body 4 includes silicone. On account of the elastic properties of silicone, the base body 4 is able to absorb mechanical loads which are caused by the different expansions of semiconductor chip and substrate when the semiconductor component is operating.

However, embodiments in which the base body 4 includes other materials are also conceivable and possible. All materials which are electrically insulating, inert with respect to their surroundings in the semiconductor component and are elastically deformable are suitable.

The carbon nanotubes 7 from FIG. 5 and FIG. 6 are applied to the contact connection surfaces 2 or 3 in the passages 5 by being grown directly thereon.

For this purpose, first of all a catalyst layer (not shown) is applied to the surface of the contact connection surfaces 2 or 3. The catalyst layer typically includes iron, nickel and/or cobalt or a mixture thereof.

Then, the carbon nanotubes 7 are grown in the passages 5 on the contact connection surfaces 2 or 3 which have been coated with the catalyst, this growth being effected using a vapor deposition process (CVD, chemical vapor deposition) or a plasma-enhanced vapor deposition process (PECVD, plasma enhanced chemical vapor deposition). Then, the respective ends of the carbon nanotubes 7 are soldered to the contact connection surfaces 2 or 3 by means of a short-time conditioning process.

After the carbon nanotubes 7 have been grown, the surface 6 of the rewiring plate is lapped and/or ground in order to make the ends of the carbon nanotubes 7 which project out of the base body 4 of equal length.

After the carbon nanotubes 7 have been applied, it is possible, depending on the type of use and/or the desired mechanical properties of the rewiring plate produced in this way, to remove the carrier plate 1, for example by etching. The embodiments illustrated in FIGS. 7 and 8 represent a rewiring plate which has a high flexibility both on account of the absence of the carrier plate 1 and on account of the high modulus of elasticity of the carbon nanotubes 7.

FIG. 9 illustrates the rewiring plate with carrier plate 1 in a possible use for which the rewiring plate is used to produce a temporary electrical connection between the semiconductor chip 9 or its contact surfaces 10.

For this purpose, metallic intermediate contacts 11 have been applied to the rewiring plate and seal the passages 5, which include the carbon nanotubes 7, by means of a short-time conditioning process, so that they serve in particular to protect the carbon nanotubes 7 from damage by mechanical loads. A rewiring plate of this type, for contact-connection of the semiconductor chip 9, is brought into positively locking contact with the latter and if necessary can be removed again.

As illustrated in FIG. 9, the rewiring plate has more conductive passages 5 than the semiconductor chip 9 has contact surfaces 10. The arrangement of the passages 5 is such that the same rewiring plate can be used for various semiconductor chips 9 each with a different arrangement of the contact surfaces 10.

FIG. 10 illustrates the rewiring plate, which has been cohesively applied to the semiconductor chip 9 for the purposes of permanent contact connection. The carbon nanotubes 7 are now in direct electrically conductive contact with the chip-side contact surfaces 10, and the rewiring plate can no longer be removed from the semiconductor chip 9 without one or the other being destroyed.

As in the case of the rewiring plate illustrated in FIG. 9, the rewiring plate has more conductive passages 5 than the semiconductor chip 9 has contact connection surfaces 10. The idea is that the same type of rewiring plate can be used for different semiconductor chips 9 with in each case different arrangements of contact surfaces.

In the form of use of the present invention illustrated in FIG. 11, the rewiring plate is used as a rewiring level. A rewiring level of this type is required to allow contact connection of very small contact connection surfaces 10, i.e., with diameters in the micrometer and nanometer range, by conventional methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A rewiring plate for components with a dense connection grid, the rewiring plate comprising:
   a base body having passages and including silicone; and
   a plurality of carbon nanotubes positioned within the passages, a lower end of the passages opening out into contact connection surfaces, wherein the carbon nanotubes form an electrically conductive connection from the contact connection surfaces to a front surface of the base body.

2. The rewiring plate of claim 1, wherein the carbon nanotubes are electrically conductive.

3. The rewiring plate of claim 1, wherein the carbon nanotubes have semiconductive properties.

4. The rewiring plate of claim 1, wherein the diameter of the contact connection surfaces and the distance between the contact connection surfaces are in the range of from approx. 100 nm to approx. 10 µm.

5. The rewiring plate of claim 1, wherein the passages each include one carbon nanotube.

6. The rewiring plate of claim 1, wherein the passages each include a plurality of carbon nanotubes or a carbon nanotube bundle.

7. The rewiring plate of claim 1, wherein the base body is applied to a carrier plate.

8. The rewiring plate of claim 1, wherein the upper end of the passage is covered with an electrically conductive layer.

9. A rewiring plate for components with a dense connection grid, the rewiring plate comprising:
   a base body having passages and including silicone; and
   a plurality of carbon nanotubes positioned within the passages, a lower end of the passages opening out into contact connection surfaces, wherein the carbon nanotubes form an electrically conductive connection from the contact connection surfaces to a front surface of the base body, and
   wherein the upper end of the passage is covered with an electrically conductive layer, and wherein the diameter of the contact connection surfaces and the distance between the contact connection surfaces are in the range of from approx. 100 nm to approx. 10 µm.

10. The rewiring plate of claim 9, wherein the passages each include one carbon nanotube.

11. The rewiring plate of claim 9, wherein the passages each include a plurality of carbon nanotubes or a carbon nanotube bundle.

12. The rewiring plate of claim 11, wherein the base body is applied to a carrier plate.

13. A rewiring plate for components with a dense connection grid, the rewiring plate comprising:
   a base body having passages and including silicone;
   a plurality of carbon nanotubes positioned within the passages, a lower end of the passages opening out into contact connection surfaces, wherein the carbon nanotubes form an electrically conductive connection from the contact connection surfaces to a front surface of the base body; and
   means covering the upper end of the passage with an electrically conductive layer, and wherein the diameter of the contact connection surfaces and the distance between the contact connection surfaces are in the range of from approx. 100 nm to approx. 10 µm.

14. The rewiring plate of claim 13, wherein the passages each include one carbon nanotube.

15. A component assembly comprising:
   a rewiring plate for components with a dense connection grid, the rewiring plate comprising:
      a base body having passages and including silicone; and
      a plurality of carbon nanotubes positioned within the passages, a lower end of the passages opening out into contact connection surfaces, wherein the carbon nanotubes form an electrically conductive connection from the contact connection surfaces to a front surface of the base body; and
   a component in communication with the rewiring plate.

16. The rewiring plate of claim 15, wherein the carbon nanotubes are electrically conductive.

17. The rewiring plate of claim 15, wherein the diameter of the contact connection surfaces and the distance between the contact connection surfaces are in the range of from approx. 100 nm to approx. 10 µm.

* * * * *